(12) United States Patent
Filkins et al.

(10) Patent No.: US 6,649,900 B2
(45) Date of Patent: Nov. 18, 2003

(54) PHOTORECEIVER ASSEMBLY FOR HIGH-POWERED LASERS

(75) Inventors: Robert Filkins, Niskayuna, NY (US); Thomas E. Drake, Fort Worth, TX (US)

(73) Assignee: Lockheed Martin Corporation, Bethesda, MD (US)

(*) Notice: Subject to any disclaimer, the term of this patent is extended or adjusted under 35 U.S.C. 154(b) by 214 days.

(21) Appl. No.: 09/949,222

(22) Filed: Sep. 7, 2001

(65) Prior Publication Data

US 2003/0047667 A1 Mar. 13, 2003

(51) Int. Cl.[7] .......................... H04B 10/158; H03F 3/08
(52) U.S. Cl. ....................... 250/214.1; 73/643; 398/204
(58) Field of Search .............................. 250/214.1, 215; 398/202, 204; 73/610, 619, 627, 643, 655, 657, 800; 359/235

(56) References Cited

FOREIGN PATENT DOCUMENTS

| EP | 0046421 A1 | 7/1981 |
| EP | 0687061 A1 | 5/1995 |
| EP | 1065809 A1 | 7/1999 |

OTHER PUBLICATIONS

Nick Bertone and Paul Webb, "Noise and Stability in PIN Detectors", 09/96, *EG&G Optoelectronics* Canada, pp. 1–5.
C.B. Scruby and L.E. Drain, "Laser Ultrasonics—Techniques and Applications", *National Nondestructive Testing Centre, AEA Technology, Harwell Laboratory*, pp. 98–99.
International Search Report mailed Dec. 4, 2002 from the European Patent Office—6 pages.

*Primary Examiner*—Walter E. Snow
(74) *Attorney, Agent, or Firm*—Koestner Bertani, LLP

(57) ABSTRACT

A photoreceiver assembly for accurately separating at least one low level, high frequency signal carried from a large, low frequency pulse. Illustratively, in one exemplary embodiment, the photoreceiver assembly extracts a high frequency ultrasonic signal from the optical frequency of light by shining that ultrasonic base band signal onto a photodetector for conversion into an electrical signal in the bandwidth of interest. The photoreceiver assembly includes a photodetector and a splitter coupled to the photodetector. The splitter is also coupled to a plurality of transimpedance signal paths. In operation, the splitter receives a current from the photodetector, separates, and directs the current to the plurality of transimpedance signal paths. In one exemplarily embodiment, the photoreceiver further includes a transimpedance amplifier assembly coupled to at least one path of the transimpedance signal paths. The transimpedance amplifier assembly converts the high frequency component of the current into a signal voltage, such as for example a signal voltage defining an ultrasonic signal. Furthermore, the transimpedance amplifier assembly includes a forward path gain arrangement for accommodating the electrical configuration of the splitter.

10 Claims, 4 Drawing Sheets

_PHOTORECEIVER ASSEMBLY FOR HIGH-POWERED LASERS_

BACKGROUND OF THE INVENTION

The present invention generally relates to detection of various bandwidths of light and, more particularly, but not by way of limitation, to a photoreceiver assembly and method for processing a photosignal from a high-powered laser system into a plurality bandwidth signals, especially in the high-frequency bandwidth range including, for example an ultrasonic signal.

DESCRIPTION OF THE RELATED ART

Typically, a photoreceiver facilitates the conversion of photonic energy into an electrical signal in the bandwidth of interest. In general, current photoreceivers do not provide for sufficient detection in the high-frequency bandwidth range associated with ultrasonic testing of composite materials.

Illustratively, through well-established techniques in metrology, telecommunications photoreceiver systems often extract about 1.0 milliwatt (mW) of power, maybe 10 milliwatts maximum, for high-frequency bandwidth detection and signal processing. As such, instead of sending data signals over optical or electrical channels, metrology provides techniques for extracting an information signal carried along with a typically larger optical signal.

Current photoreceiver systems employ balancing techniques that typically cancel out low frequency signals through phase cancellation so as to extract a single high-frequency signal from the optical carrier. This technique is deficient in that photoreceiver systems must continuously and accurately provide for the complete cancellation of low-frequency signals. Moreover, this technique does not provide the opportunity to concurrently obtain information from low-frequency signals as well as high-frequency signals in that the low-frequency signals are cancelled out. Unfortunately, today's photoreceiver systems also do not employ metrology techniques to extract ultrasonic signals in the region from 0.5 megahertz (MHz) to 10 megahertz from a larger optical carrier.

As another shortcoming, photoreceiver systems currently do not work for optical signals having very high light levels so as to provide the requisite fidelity to measure small and/or high-frequency signals riding along with a low-frequency signal. As such, increasing the optical energy of an optical signal received by a photoreceiver system increases the signal-to-noise ratio. To enhance the fidelity of the high-frequency band of interest, an increased signal-to-noise ratio is desirable. In general, the signal-noise ratio improves as a net square root of the amount of light collected by a photoreceiver.

Today's photoreceiver systems, typically within the telecommunications industry, often collect light to provide about 1.0 milliwatt of optical power for use in identifying high-frequency bandwidths of interest. Accordingly, there does not exist a photoreceiver system that provides sufficient power to detect ultrasonic signals in the high-frequency bandwidth of interest. For example, today's photoreceivers cannot extract an ultrasonic signal in the region from 0.5 megahertz to 10 megahertz off of the optical carrier for that signal.

BRIEF SUMMARY OF THE INVENTION

In accordance with the present invention, a photoreceiver assembly accurately separates at least one low level, high-frequency signal, such as an ultrasonic signal, carried from a large, low frequency pulse. The photoreceiver assembly receives a photosignal from a source, such as a laser system, and produces a photocurrent. This photocurrent is split into two or more separate loops and amplifies each loop within that loop's transimpedance stage. Therefore, the current-to-voltage conversion process for each resulting voltage signal is optimized for the size of the signal of interest.

Unlike current balancing techniques that are hard to calibrate and require all the signals of interest to be present, the present invention introduces a simplified metrological configuration that uses a photodetector and splitter to isolate various bandwidths of interest. The photoreceiver assembly includes a photodetector and a splitter coupled to the photodetector. The splitter is also coupled to a plurality of transimpedance signal paths. In operation, the splitter receives a current from the photodetector, separates, and directs the current to the plurality of transimpedance signal paths. For example, the splitter extracts a high-frequency ultrasonic signal from a large, low-frequency signal and directs the ultrasonic signal to one path of the plurality of transimpedance signal paths for conversion to a voltage signal via a transimpedance amplifier assembly coupled to the path.

In one exemplary embodiment, the splitter comprises a T-network transformer system. Thus, for a trigger condition, the transformer system sends photocurrent from the primary to the secondary of a transformer so as to separate a high-frequency signal component of the photocurrent from a low frequency component that bypasses the secondary. If the trigger condition is not satisfied, however, the transformer system is a short circuit such that current from the photodetector flows directly to a low-frequency register via a shunt assembly.

It should also be said that in this disclosure and the appended claims, the term "trigger condition" refers to at least one stimulus based on time and/or physical circumstances. For example, a trigger condition may be a timer sequence or frequency bandwidth condition. Moreover, in one exemplary embodiment, a trigger condition comprises a predetermined circumstance.

A high-frequency unit is coupled to the high-frequency path and includes a forward path gain arrangement and a high-frequency transimpedance amplifier arrangement. The forward path gain arrangement is configured to receive high-frequency current from the transformer system while providing for a large voltage signal beyond the rated voltage requirement for operating the transformer. The high-frequency transimpedance amplifier arrangement converts the high-frequency component of the photocurrent into a signal voltage, such as for example a signal voltage defining the ultrasonic signal. Further along each path a controlled amplifier may be positioned to tune the resulting signal voltage. These controlled amplifiers may be computer-controlled amplifiers in one embodiment, buffer amplifiers in another embodiment, and a combination of a common-mode choke unit and a voltage-controlled amplifier assembly in yet another embodiment.

Ultimately, the photoreceiver assembly provides at least two voltage signals for processing, for example a low-frequency pulse as well as a high-frequency signal extracted from that pulse. For example, in laser systems, the low-frequency pulse may be provided to an interferometer stabilization system comprising a feedback control for maintaining generation of laser induced photosignals in the bandwidth of interest. As another example, an ultrasonic voltage signal may be received for signal processing and image generation of a component part as that part is subjected to laser ultrasound.

Still other intentions, objects, features, and advantages of the present invention will become evident to those skilled in the art in light of the following.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION OF THE PREFERRED EMBODIMENT

As required, detailed embodiments of the present invention are disclosed herein, however, it is to be understood that the disclosed embodiments are merely exemplary of the invention, which may be embodied in various forms, figures are not necessarily to scale, and some features may be exaggerated to show details of particular components or steps.

Generally, FIGS. 1–4 illustrates a photoreceiver assembly 50. The photoreceiver assembly 50 receives a photosignal from a source and is capable of sending a plurality of signals therefrom.

Figure 1:
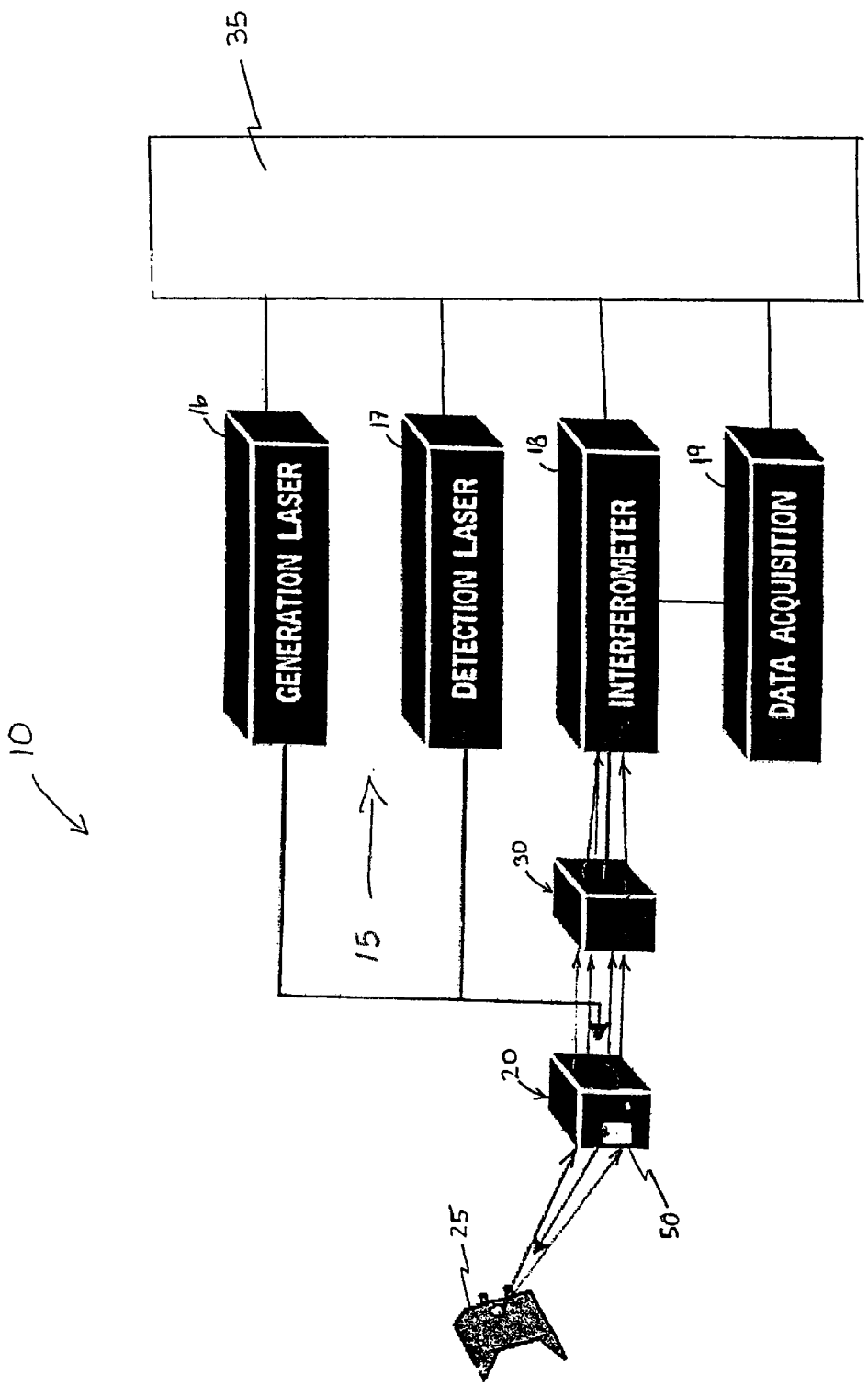
FIG. 1 is a schematic diagram of a photoreceiver assembly operating in conjunction with a high-powered laser system.

For purposes of illustration, although those of ordinary skill in the art will readily recognize any suitable source for providing a photosignal therefrom, FIG. 1 shows a photoreceiver assembly 50 for use with a lasing system 10 for generating and processing ultrasonic signals. Laser ultrasound typically involves the generation and detection of ultrasonic data associated with material components via laser emission.

Often, ultrasonic energy is transmitted from a generation laser 16, such as for example a pulsed laser, to a target component 25. This ultrasonic laser energy produces small displacements at the surface of the part 25. As the component 25 is displaced by the generation laser 16, a detection laser 17 reflects light off the rapidly moving surface of the part 25 so as to create a doppler or frequency shifted optical return signal or, commonly, "photosignal".

The scattered light defining the photosignal is collected and processed by an interferometer 18 and converted by a data acquisition unit 19. The interferometer demodulates the phase or frequency modulation from the photosignal by converting the frequency modulation of the laser into a current modulation of the laser intensity. Moreover, the ultrasonic or "base band" signals are carried by the reflected laser light as phase modulation or high-frequency side bands of the optical frequency. Thus, the ultrasonic signal is extracted from the optical frequency of light by shining the base band signal onto a photodetector, the base band signal is converted by the photodetector into an electrical signal in the bandwidth of interest. Sensitivity to ultrasonic displacements of a component part 25 in a laser based detection system 10 is typically proportional to the square root of the amount of optical energy that interacts with the moving surface of the part 25 and is subsequently collected by the detection system 10. Thus, in one exemplary embodiment, the laser based detection system 10 comprises a high-powered, pulsed laser system. Generally high-powered, pulsed laser systems provide large peek optical power and low average power to avoid burning a part.

The photoreceiver assembly 50 extracts ultrasonic echoes from the photosignal including a large, low frequency component on which a low level, high-frequency component rides. The photoreceiver assembly 50 separates the large, low frequency optical pulse from the high-frequency ultrasonic signal and processes the two signals in parallel to allow optimization of the gain, bandwidth, and signal-to-noise ratio for each parallel path. A processor 35 coupled to the photoreceiver assembly 50 in one exemplary embodiment, receives the ultrasonic signal for processing thereof.

Figure 2:
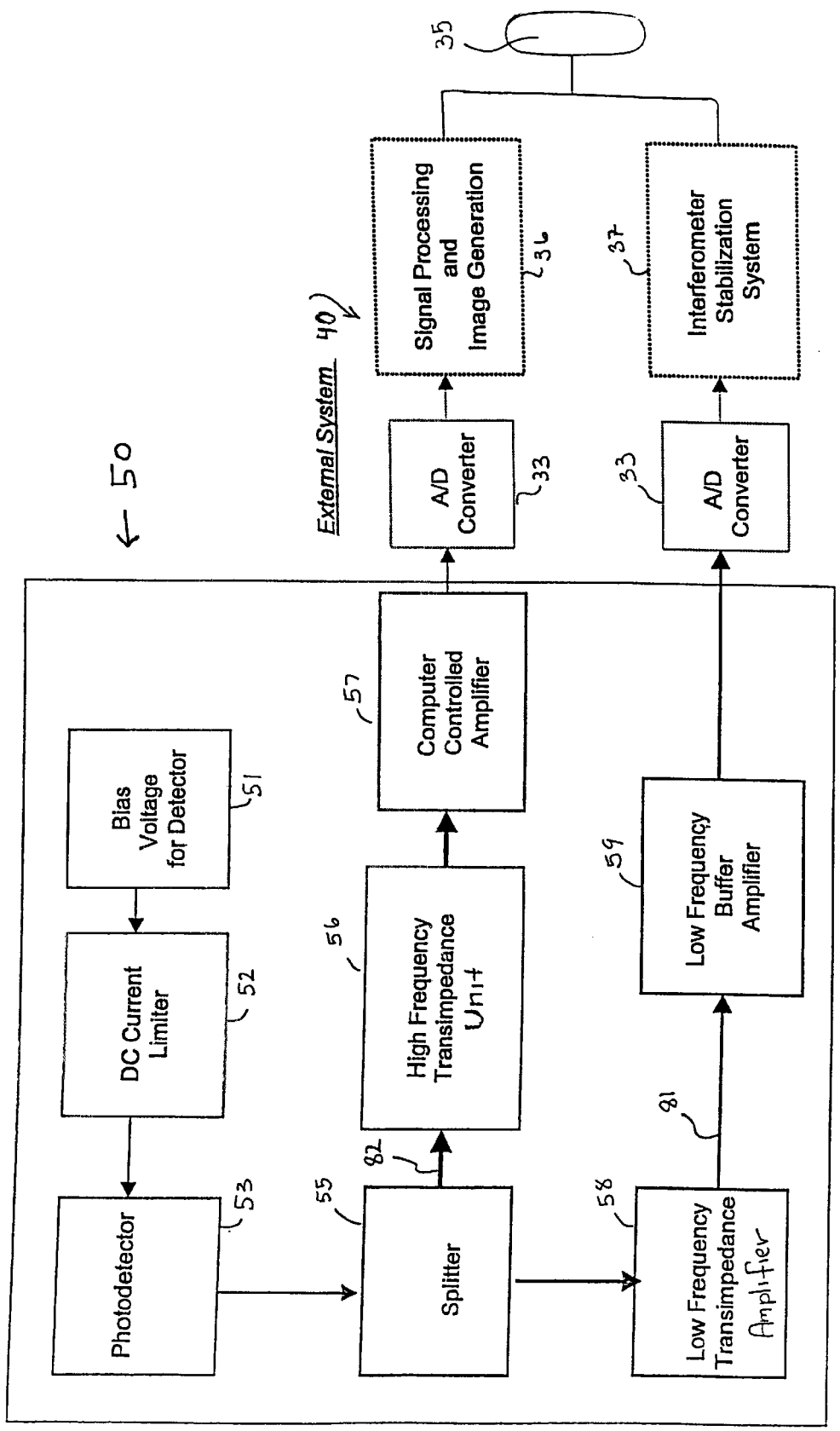
FIG. 2 is a block diagram of one exemplary embodiment of a photoreceiver assembly, the photoreceiver assembly providing at least one signal to an external system.

FIG. 2 shows one exemplary embodiment of the photoreceiver assembly 50 in operative engagement with an external system 40. The external system 40 processes at least one signal received from the photoreceiver assembly 50.

The external system 40 in the exemplary embodiment of FIG. 2 also establishes a feedback loop system 37 based on the at least one signal received from the photoreceiver assembly 50. For example, the feedback loop system 37 may comprise an interferometer stabilization system. The interferometer stabilization system 37 receives a large low-frequency pulse from the photoreceiver system 50 and adjusts the laser system 10 to optimize the laser light reflected off of the rapidly moving surface of the component part 25 for collection by the interferometer 18 of FIG. 1.

For the exemplary embodiment of FIG. 2, the external system 40 further includes at least one analog-to-digital converter 33. As such, the analog-to-digital converter 33 transforms the character of a signal received from the photoreceiver assembly 50 from a voltage to a digital signal.

The photoreceiver assembly 50 of FIG. 2 separates a low level, high-frequency signal from a large low-frequency pulse and amplifies that extracted small RF signal. In general, for exemplary embodiments of FIGS. 1–4, the photoreceiver assembly 50 includes a photocurrent splitter 55 for separating a photocurrent produced by a photodetector 53 into two loops, and amplifies each loop with its own transimpedance stage. Those of ordinary skill in the art will readily recognize that the photocurrent splitter 55 can split a photocurrent into a plurality of loops for allowing a plurality of signals. Thus, each current-to-voltage conversion process performed by the photoreceiver assembly 50 is optimized for the size of the signal of interest. As discussed below, in FIG. 4, the photocurrent splitter 55 includes a transformer system. The transformer system comprises a transformer coupled in series with a resistive shunt to avert a photo-induced current loop from the photodetector 53 into two loops.

With specific reference to FIGS. 1 and 2, a light source 15, such as a high-powered laser for example, reflects a photosignal off of a workpiece 25 onto the photoreceiver 50. In the preferred embodiment of FIG. 2, the photoreceiver assembly 50 includes a bias voltage for receiving the photosignal. The bias voltage 51 establishes time spacing of the photosignal as required by the photoreceiver 50.

In the exemplary embodiment of FIG. 2, the photocurrent travels from the bias voltage 51 to a current limiter 52. The DC current limiter 52 ensures that the photosignal maintains a predetermined waveform characteristic prior to entering a photodetector 53.

The photodetector 53 converts photonic energy, defining the photosignal and striking the detector 53, into an electrical signal in the bandwidth of interest. Thus, those of ordinary skill in the art would readily recognize any suitable photodetector of a type well known in the industry for converting the photosignal into a photocurrent, such as for example a silicon PIN photodiode. Examples of silicon PIN photodiodes include a YAG—44A or TAG—100silicon PIN photodiode manufactured by EG&G Optoelectronics Group of Canada and a G5832—02 InGo-As PIN or S1223silicon PIN from Hammamatsu Corp. of Japan.

The splitter 55, coupled to the photodetector 53, receives the current from the photodetector 53. For the exemplary embodiments of FIGS. 1–4, the splitter 55 comprises a T-network to separate the current received from the photodetector 53 into a plurality of separate loops. Although those of ordinary skill in the art will recognize that the splitter 55 may separate the photocurrent into any desired number of loops, the splitter 55 for the exemplary embodiments of FIGS. 1–4 divides the current from a photodetector 53 into two separate loops 81, 82.

Specifically, the splitter 55 includes a transformer system. The transformer system includes a transformer coupled in series with a resistive shunt. Moreover, the splitter 55 is coupled to the plurality of transimpedance signal paths 81, 81.

In one exemplary embodiment in all conditions at or below a trigger condition, the transformer acts as a short circuit with some resistance so that low-frequency information flows from the photodetector directly through the transformer and into a shunt assembly. This shunt register includes a resistor and may include a capacitor placed in parallel to provide an AC shunt and to further tune the bandwidth of the low-frequency path 81.

Moreover, in all conditions above a trigger condition, the separator 55 bleeds off a high-frequency signal from the large pulse as the large pulse flows into the shunt and low-frequency transimpedance path 81. In particular, above the trigger condition, current travels from the photodetector 53 to the transformer within the splitter 55. As such, the transformer system sends the current from the primary to the secondary of the transformer. On reaching the secondary, the high-frequency component of the current is subjected to the transimpedance stage as it flows through the high-frequency path 82 coupled to the secondary. It should also be added that in one exemplary embodiment, the trigger condition comprises a predetermined circumstance.

In short, within the splitter 55, current first flows into the primary such that the transformer will not operate at or below a certain bandwidth so that the primary acts as a short circuit. However, above the cut-off frequency, the transformer directs a desired frequency across the secondary to a transimpedance path. Illustratively, for the exemplary embodiments of FIGS. 1–4, the trigger condition may comprise a cutoff frequency of 100 kilohertz (kHz) or in the range of between about 10 kilohertz to 100 kilohertz.

For light sensing, the photodiode 55 introduces a current within the photo receiving assembly 50. To convert this current into a voltage signal for signal processing, a transimpedance amplifier assembly is coupled to at least one path 81, 82 associated with the splitter 55. Accordingly, for the large, low-frequency path 81, the transimpedance amplifier assembly includes a low-frequency transimpedance amplifier 58. The low-frequency transimpedance amplifier 58 converts the shunted current from the splitter 55 and photodetector 53 to a low-frequency transimpedance signal voltage. This signal voltage is received by a buffer amplifier 59 to isolate that voltage signal from the effects of load impedance variation. From the buffer amplifier, the voltage signal is received for use by an external system 40, such as for example the interferometer stabilization system 37 shown in FIG. 2.

Similarly, for the high-frequency path 82, the transimpedance amplifier assembly includes a high-frequency transimpedance unit 56. In general, the high-frequency unit sizes the resistance voltage large so that the current from the secondary is reverted into a proportionally large voltage signal. This transimpedance is accomplished, in part, by masking the photocurrent to look like a smaller impedance so that the transformer system of the splitter 55 will continue to operate properly.

Accordingly, the high-frequency transimpedance unit 56 includes a forward path gain arrangement. In effect, the forward path gain arrangement separates input impedance to resemble the resistance divided by the gain of the forward path.

Figure 4:
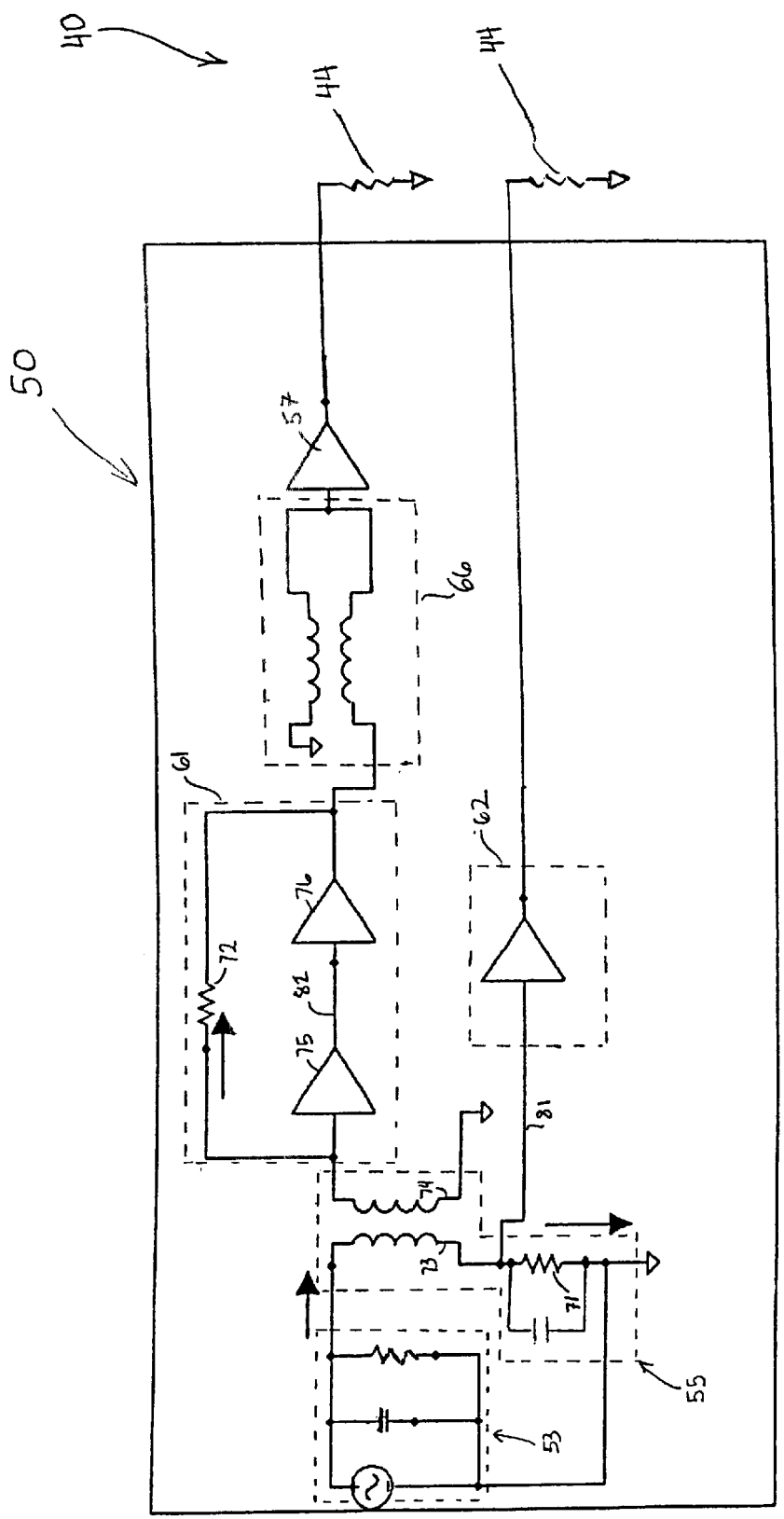
FIG. 4 is a circuit diagram of the exemplary embodiment of FIG. 2.

For example, in FIG. 4, consider a high-frequency resistance across resistor 72. During the transimpedance stage, the forward path gain arrangement divides input impedance to look like the resistance across resistor 72 divided by a gain along the forward path 82. Illustratively, consider for example the forward path 82 in FIG. 4 having a first amplifier 75 and a second amplifier 76, respectively, thus having a gain of 27.2 and a gain of 1.4 yielding a total gain of 38. Therefore, in operation, the resistance of 1.9 kilo ohm (kΩ) across resistor 72 may be designed to operate as a 50 ohm (Ω) load to allow the transformer to function in that the forward path gain arrangement. Ultimately the forward path gain arrangement allows the transformer to mirror the current with a large gain and provide optimal signal-to-noise ratio.

The high-frequency unit further includes a high-frequency transimpedance amplifier arrangement coupled to the forward path gain arrangement. The high-frequency transimpedance amplifier arrangement converts the high-frequency component of the current into a signal voltage, including the signal voltage defining the ultrasonic signal. The signal voltage is sent from the high-frequency transimpedance unit 56 to a computer-controlled amplifier 57 for buffering of the signal. Alternatively, in the exemplary embodiment of FIG. 4, the voltage signal travels from a high-frequency transimpedance unit 56 to a common-mode choke unit 66. The common-mode choke unit 66 ensures good rejection of electromagnetic interference, power supply noise, and ground loops. The common-mode choke unit 66 compensates for the relatively poor common-mode rejection ratio provided by a voltage-controlled amplifier 57.

Once buffered and amplified, the high-frequency voltage signal is sent from the photoreceiver assembly 50 to the external system 40. As such, the voltage signal is processed for information 36. Moreover, the voltage signal may be displayed by the external system 40 via an image generator 36.

Figure 3:
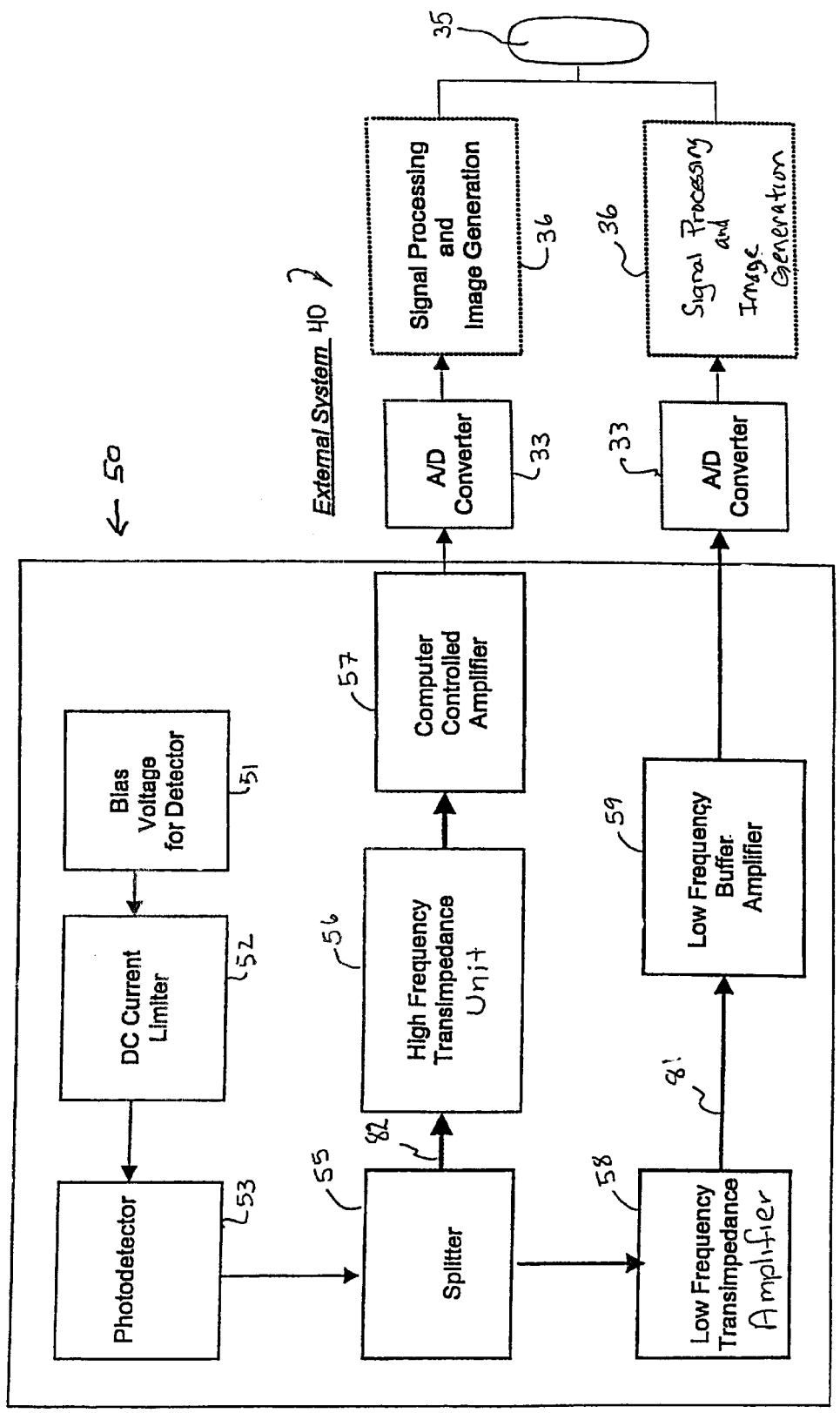
FIG. 3 is a block diagram of another exemplary embodiment of a photoreceiver assembly, the photoreceiver assembly providing at least one signal to an external system.

Referring to the exemplary embodiment of FIG. 3, the photoreceiver assembly is identical to the photoreceiver of the embodiment of FIG. 2. By contrast, the external system of FIG. 3 provides for signal processing and image generation 36 of the low-frequency voltage signal.

The exemplary embodiment of the photoreceiver assembly 50 shown in FIG. 4 refers to a solid-state embodiment of the present invention. As such, FIG. 4 shows a photodetector 53 coupled to a splitter 55. The splitter 55 includes a transformer with a primary 73 and a secondary 74, and includes a resistive shunt through resistor 71. The embodiment of FIG. 4 further includes a low-frequency transimpedance path 81 and a low-frequency transimpedance amplifier assembly 62 coupled to the path 81. Similar to the low-frequency transimpedance amplifier and buffer amplifier of the embodiments of FIG. 2 and FIG. 3, the low-frequency transimpedance amplifier assembly 62 of FIG. 4 creates and conditions a voltage signal. This voltage signal is sent to a load 44 provided by the external system 40. The load 44 may include an input for signal processing or input to an analog-to-digital converter.

A high-frequency path 82 separates out at least one RF signal from the low-frequency pulse. The register 82 includes a high-frequency transimpedance unit 61. The unit 61 including a forward gain path arrangement and a high-frequency transimpedance path arrangement coupled to the forward path gain arrangement. Whereas the photoreceiver assembly of FIGS. 2 and 3 include a computer-controlled amplifier 57, the high-frequency path 82 of FIG. 4 alternatively provides a common-mode choke unit 66 coupled with a voltage-controlled amplifier 57. Thus, a resulting high-frequency voltage signal is sent to an external load 44, typically for signal processing.

In sum, the operation of one exemplary embodiment of the photoreciever assembly includes sending a photo signal, such as for example laser energy, from a source to the photoreceiver assembly. The photodetector of the photoreceiver assembly receives the photosignal and generates a current based on the photosignal. The splitter, in turn, extracts a desired signal, such as a high-frequency or ultrasonic signal from the optical frequency of light. This electrical signal and the bandwidth's interest is then directed to one path of a plurality of transimpedence signal paths for conversion to a voltage signal via a transimpedence amplifier assembly coupled to the path. The voltage signal is then sent from the photoreceiver assembly for signal processing thereof.

Although the present invention has been described in terms of a foregoing embodiment, such description has been for exemplary purposes only and, as will be apparent to those of ordinary skill in the art, many alternatives, equivalents and variations will fall within the scope of the present invention. That scope, accordingly, is not to be limited in any respect by the foregoing description, rather, the scope is also defined by the claims that follow.

What is claimed is:

1. A photoreceiver assembly, the photoreceiver receiving a signal from a high powered laser system and capable of sending a plurality of signals, including an ultrasonic signal, the photoreceiver assembly comprising:
   a photodetector;
      the photodetector providing a current;
   a splitter coupled to the photodetector;
      the splitter receiving the current from the photodetector;
   a plurality of transimpedance signal paths;
      the splitter coupled to the plurality of transimpedance signal paths and sending the plurality of signals, including the ultrasonic signal, to the plurality of transimpedance signal paths; and
   a transimpedance amplifier assembly coupled to at least one path of the transimpedance signal paths.

2. A photoreceiver assembly, the photoreceiver assembly receiving a photosignal from a lasing system and capable of sending a plurality of signals, the photoreceiver assembly comprising:
   a photodetector;
   a splitter coupled to the photodetector; and
   a plurality signal paths;
      the splitter coupled to the plurality of signal paths and, for a trigger condition, sending the plurality of signals to the plurality of signal paths.

3. A photoreceiver assembly, the photoreceiver assembly receiving a photosignal and capable of sending a plurality of signals, the photoreceiver assembly comprising:
   a photodetector,
   a splitter coupled to the photodetector; and
   a plurality of signal paths;
      the splitter coupled to the plurality of signal paths and, for a trigger condition, sending the plurality of signals to the plurality of signal paths.

4. A lasing system comprising:
   a source;
      the source sending laser energy to the object;
   a photoreceiver;
      the photoreceiver receiving the laser energy reflected from the object;
      the photoreceiver including a splitter and a plurality of signal paths coupled to the splitter;
      the splitter separating a signal associated with the laser energy received into at least one high frequency signal and a low frequency signal;
   a processor coupled to the plurality of signal paths;
      the processor receiving the at least one high frequency signal.

5. A high powered lasing system comprising:
   a source;
      the source sending high powered laser energy to the object;
   a photoreceiver;
      the photoreceiver receiving high powered laser energy reflected from the object and sending a low frequency signal and at least one ultrasonic signal, each signal associated with the object;
      the photoreceiver including a plurality of signal paths and a splitter coupled to the plurality of signal paths; and
   the splitter separating the at least one ultrasonic signal carried from the low frequency signal;
   a processor coupled to the plurality of signal paths;
      the processor receiving the at least one ultrasonic signal.

6. A method for processing a photosignal from a high powered laser system, the method comprising the steps of:
   sending the photosignal from the high powered laser system to a photoreceiver assembly;
   the photoreceiver assembly comprising:
      a photodetector;
      a splitter coupled to the photodetector; and
      a plurality of transimpedance signal paths;
   achieving a trigger condition for the photoreceiver assembly;
   separating the photosignal into a plurality of signals with the splitter; and
   sending at least one of the signals of the plurality of signals through the plurality of signal paths coupled to the splitter from the photoreceiver to an external operation.

7. A method for processing a photosignal from a lasing system, the method comprising the steps of:

sending the photosignal from the lasing system to a photoreceiver assembly;

the photoreceiver assembly comprising
a photodetector;
a splitter coupled to the photodetector; and
a plurality of transimpedance signal paths;

achieving a trigger condition for the photoreceiver assembly;

separating the photosignal into a plurality of signals with the splitter; and sending at least one of the signals of the plurality of signals through the plurality of signal paths coupled to the splitter from the photoreceiver to an external operation.

8. A method for processing a photosignal from a source, the method comprising the steps of:

sending the photosignal from the source to a photoreceiver assembly;

the photoreceiver assembly comprising
a photodetector;
a splitter coupled to the photodetector; and
a plurality of transimpedance signal paths;

achieving a trigger condition for the photoreceiver assembly;

separating the photosignal into a plurality of signals with the splitter; and sending at least one of the signals of the plurality of signals through the plurality of signal paths coupled to the splitter from the photoreceiver to an external operation.

9. A method of obtaining ultrasonic information associated with an object, comprising the steps of:

sending laser energy from a source to the object;

receiving a photosignal associated with the laser energy reflected from the object via a photoreceiver assembly; the photoreceiver including a splitter;

separating the photosignal into at least one ultrasonic signal and a low frequency signal via the splitter; and creating ultrasonic information based on the at least one ultrasonic signal.

10. A method of lasing, comprising the steps of:

sending laser energy from a source to an object;

receiving a photosignal associated with the laser energy reflected from the object via a photoreceiver assembly; the photoreceiver including a splitter;

separating the photosignal into at least one high frequency signal and a low frequency signal via the splitter; and processing data associated with the at least one high frequency signal.

* * * * *